(12) United States Patent
Liao et al.

(10) Patent No.: US 10,854,509 B2
(45) Date of Patent: Dec. 1, 2020

(54) METHOD FOR MAKING ELECTRICAL CONNECTION STRUCTURE HAVING ALTERNATING YTTRIUM OXIDE AND SILICON OXIDE FILMS

(71) Applicant: HON HAI PRECISION INDUSTRY CO., LTD., New Taipei (TW)

(72) Inventors: Chin-Yueh Liao, New Taipei (TW); Chia-Lin Liu, New Taipei (TW); Yan-Tang Dai, New Taipei (TW); Hung-Che Lu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/239,985

(22) Filed: Jan. 4, 2019

(65) Prior Publication Data

US 2019/0237492 A1  Aug. 1, 2019

(30) Foreign Application Priority Data

Jan. 25, 2018 (CN) .......................... 2018 1 0073674

(51) Int. Cl.
*H01L 21/768* (2006.01)
*H01L 51/05* (2006.01)
*H01L 27/12* (2006.01)

(52) U.S. Cl.
CPC ...... *H01L 21/76834* (2013.01); *H01L 27/124* (2013.01); *H01L 27/1248* (2013.01); *H01L 27/1262* (2013.01); *H01L 51/0545* (2013.01)

(58) Field of Classification Search
CPC .................... H01L 21/76834; H01L 51/0545
See application file for complete search history.

(56) References Cited

U.S. PATENT DOCUMENTS

| 2007/0158652 | A1* | 7/2007 | Lee ................ G02F 1/13439 257/59 |
| 2014/0335332 | A1* | 11/2014 | Bellman ............ G02B 1/105 428/212 |
| 2016/0351596 | A1 | 12/2016 | Liao et al. |
| 2017/0278900 | A1 | 9/2017 | Yang et al. |

FOREIGN PATENT DOCUMENTS

| TW | 201641995 A | 12/2016 |
| TW | 201734598 A | 10/2017 |

* cited by examiner

*Primary Examiner* — Michael Jung
(74) *Attorney, Agent, or Firm* — ScienBiziP, P.C.

(57) ABSTRACT

A method for making an electrical connection structure includes: providing a substrate; forming a mating layer on the substrate; forming a connecting pad on the mating layer; forming a connecting line on the connecting pad and electrically coupling to the connecting pad; forming a covering layer covering the connecting line; and light irradiating the covering layer. Both the connecting pad and the connecting line are made of a metal or an alloy. The mating layer includes alternating yttrium oxide films and silicon oxide films.

10 Claims, 14 Drawing Sheets

METHOD FOR MAKING ELECTRICAL CONNECTION STRUCTURE HAVING ALTERNATING YTTRIUM OXIDE AND SILICON OXIDE FILMS

FIELD

The subject matter herein generally relates to an electrical connection structure, a method for making the electrical connection structure, a thin film transistor (TFT) substrate and a method for making the TFT substrate.

BACKGROUND

A liquid crystal display panel generally includes a TFT substrate, a color filter substrate, and a liquid crystal layer between the TFT substrate and the color filter substrate. The TFT substrate generally includes a base substrate, TFTs, storage capacitors, connecting pads, and connecting lines on the base substrate. The TFT substrate further includes an insulating layer to cover the TFTs, the storage capacitors, the connecting pads, and the connecting lines. The insulating layer is etched by exposing and development. However, exposure of the insulating cover layer tends to make the surface of the insulating layer uneven, which affects stability of the TFT substrate.

Therefore, there is room for improvement in the art.

BRIEF DESCRIPTION OF THE DRAWINGS

Implementations of the present technology will now be described, by way of embodiments only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like.

In a formation process of a TFT substrate of a liquid crystal display, an insulating layer is often formed on the electrical connection structures of the TFT substrate, and then the insulating layer is exposed to in order to define holes in the insulating layer or bleach the insulating layer. However, exposure of the insulating layer tends to make the surface of the insulating layer uneven. The present disclosure is made because the reason for the insulating layer being uneven is found to be (mainly) that the electrical connection structures made of metal reflect the light of the exposure back into the insulating layer, and the insulating layer thereby suffers double exposure leading to the unevenness.

Figure 1:
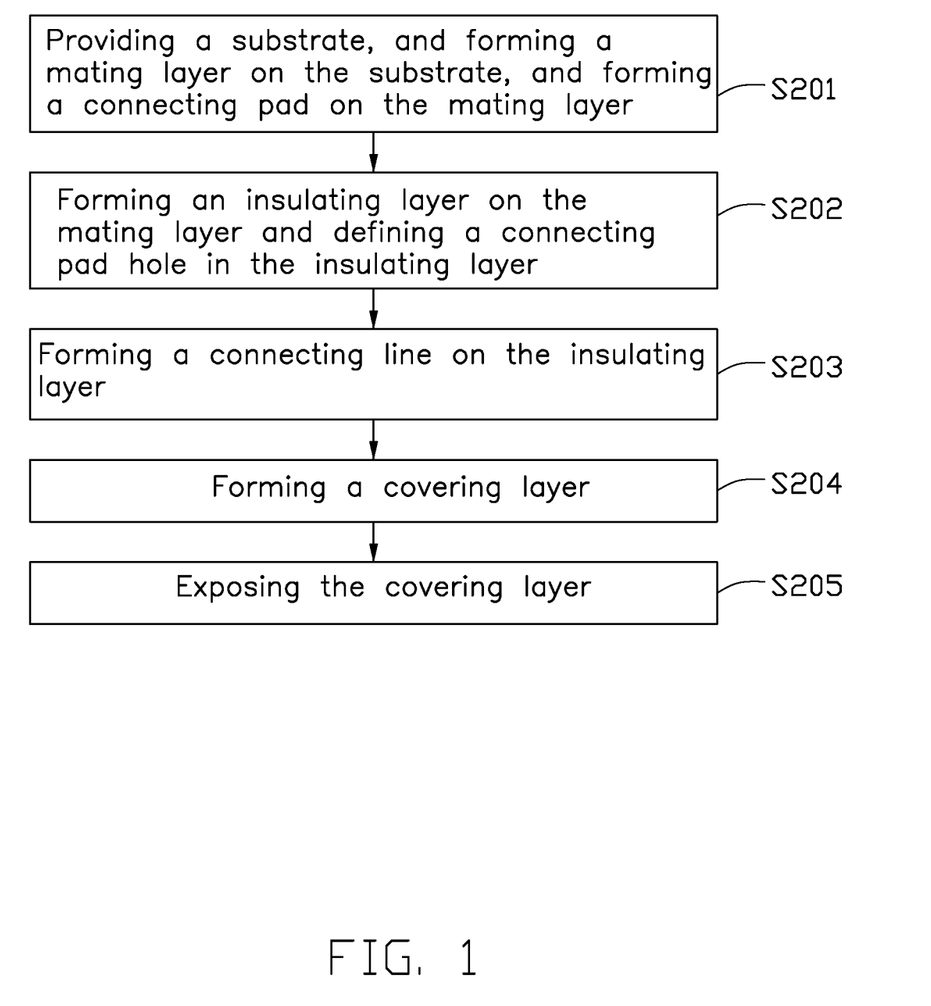
FIG. 1 is a flowchart of a method for making an electrical connection structure according to an embodiment of the present disclosure.

FIG. 1 illustrates a method for making an electrical connection structure as follows.

Figure 2:
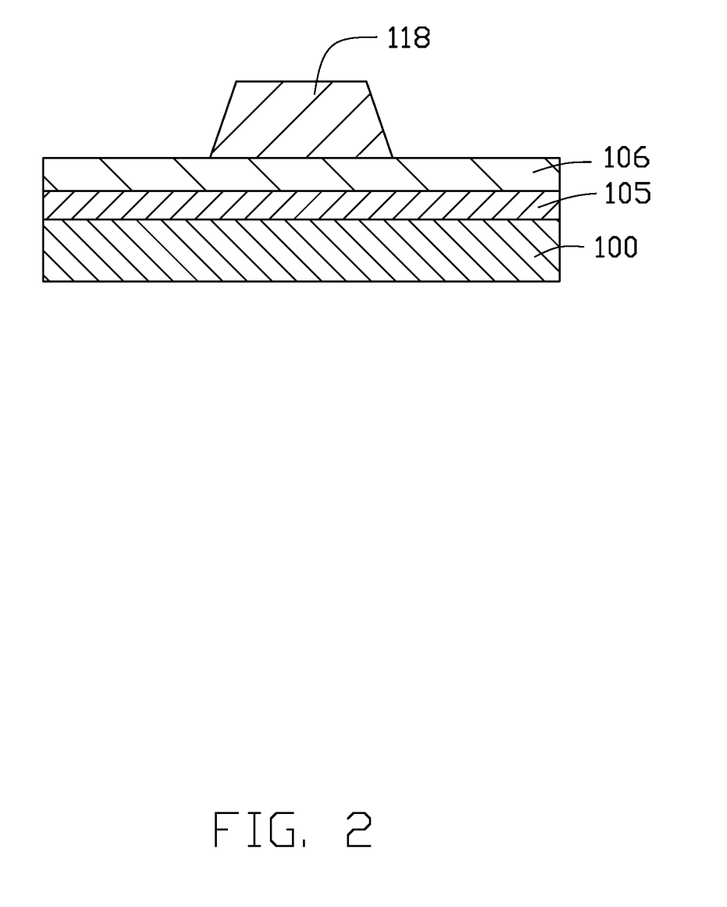
FIG. 2 through FIG. 6 are cross-sectional views showing steps of the method of FIG. 1.

In block S201, a substrate 100 is provided, a buffer layer 105 is formed on the substrate 100, and a mating layer 106 is formed on the buffer layer 105, and a connecting pad 118 is formed on the mating layer 106 (shown in FIG. 2).

As shown in FIG. 2, the buffer layer 105 covering the substrate 100 is firstly formed on the substrate 100 then the mating layer 106 covering the buffer layer 105 is formed on the buffer layer 105. A metal layer (not shown) covering the mating layer 106 is formed on the mating layer 106 and finally the metal layer is patterned to form the connection pad 118.

In the present embodiment, the substrate 100 is made of a transparent material, such as transparent glass, transparent quartz, or transparent polymer. The buffer layer 105 is made of a transparent and insulating material, such as silicon oxide, silicon nitride, and silicon oxynitride.

In other embodiments, the buffer layer 105 can be omitted and the mating layer 106 can be directly formed on the substrate 100.

Figure 14:
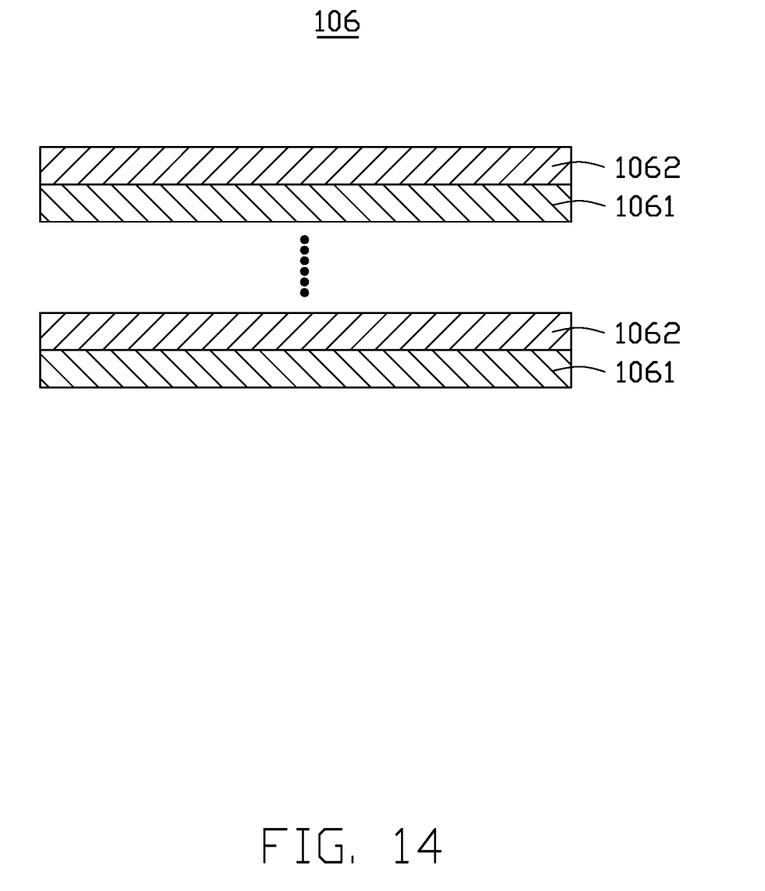
FIG. 14 is a cross-sectional view of a mating layer according to an embodiment of the present disclosure.

As shown in FIG. 14, the mating layer 106 can be a multilayer film including yttrium oxide films 1061 and silicon oxide films 1062 which alternate. The mating layer 106 can have a thickness of 100-1000 angstroms.

Figure 3:
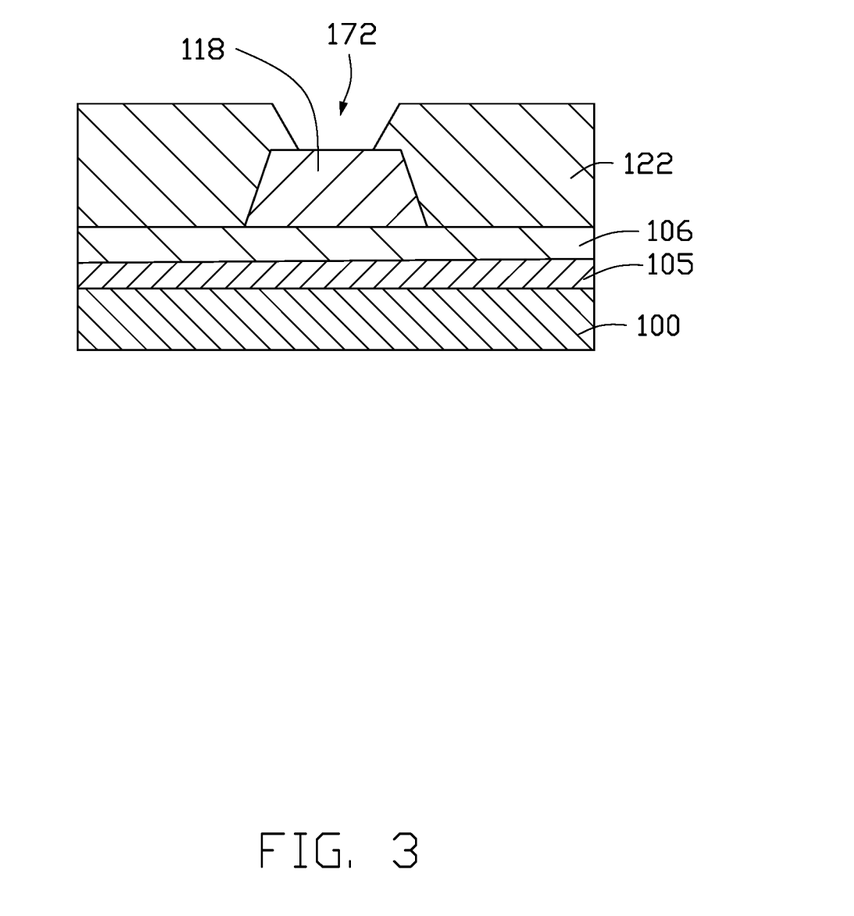

In block S202, an insulating layer 122 is formed and a connecting pad hole 172 is defined in the insulating layer 122 (shown in FIG. 3).

As shown in FIG. 3, the insulating layer 122 covering the connection pad 118 is formed on the mating layer 106, and the insulating layer 122 is etched to form the connecting pad hole 172 aligning with the connection pad 118. The connection pad 118 is exposed from the insulating layer 122 by the connecting pad hole 172.

In the present embodiment, the insulating layer 122 is made of a transparent and insulating material, such as silicon oxide, silicon nitride, and silicon oxynitride.

Figure 4:
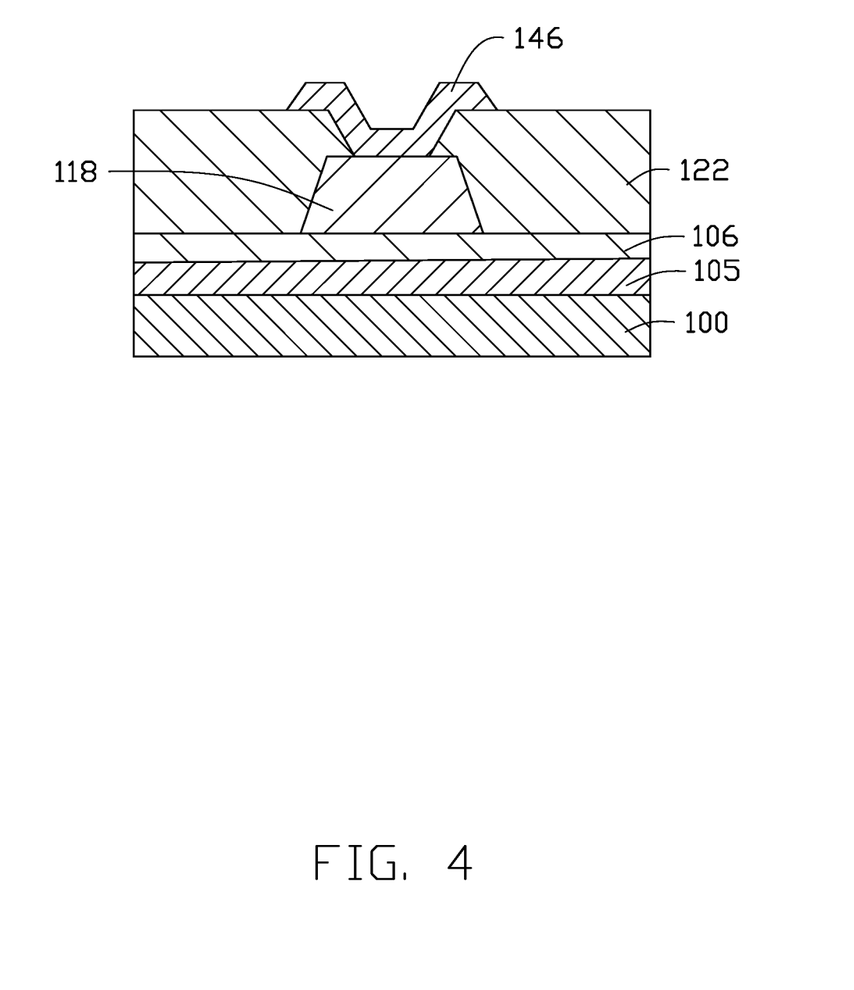

In block S203, a connecting line 146 is formed (shown in FIG. 4).

As shown in FIG. 4, the connecting line 146 is formed on a side of the insulating layer 122 away from the substrate 100 and extends into the connecting pad hole 172 to electrically couple to the connection pad 118. The connecting line 146 can be formed by forming a metal layer (not shown) on a side of the insulating layer 122 away from the substrate 100 and pattering the metal layer to form the connecting line 146.

In the present embodiment, the connecting line 146 can be made of at least one metal, such as aluminum, titanium, molybdenum, niobium, and copper.

It will be understood that the electrical connection structure of the present disclosure is not limited to the one described above, and may include other layer structures such as other types of electrical connection structures having a semiconductor layer. For example, the electrical connection structure may be a TFT array substrate.

In block S204, a covering layer 152 is formed on the insulating layer 122. The covering layer 152 covers the connecting line 146 (shown in FIG. 5).

Figure 5:
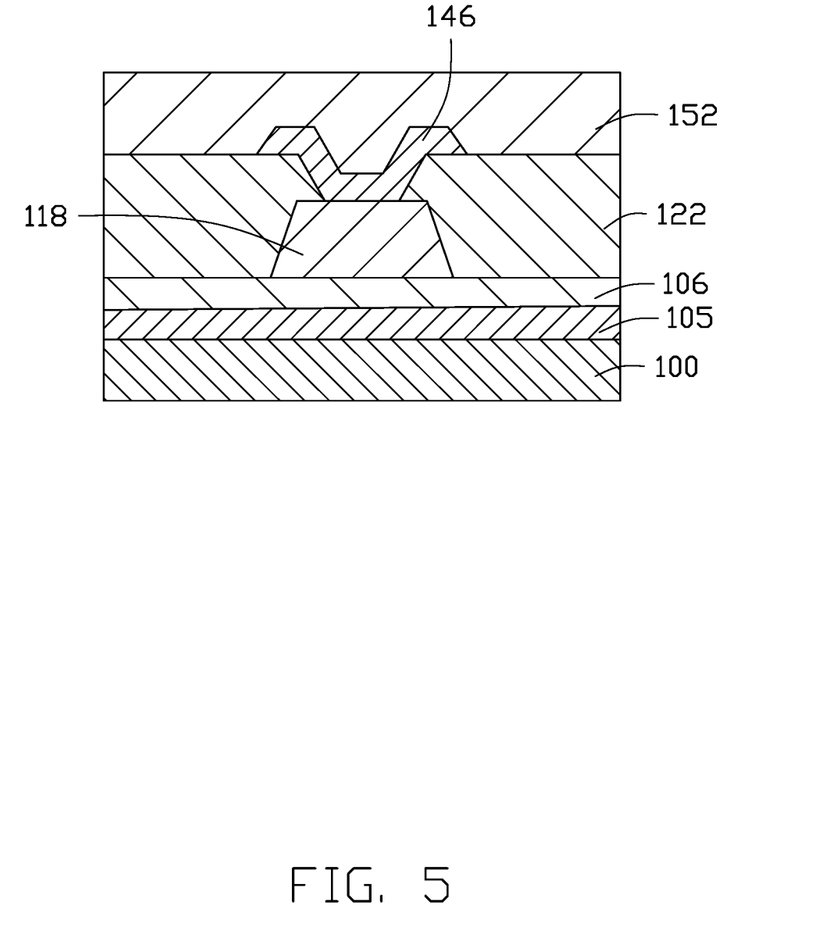

In the present embodiment, the covering layer 152 may be made of an insulating organic material which is often used as passivation layer, such as polycarbonate (PC) and benzocycloethylene (BCB).

Figure 6:
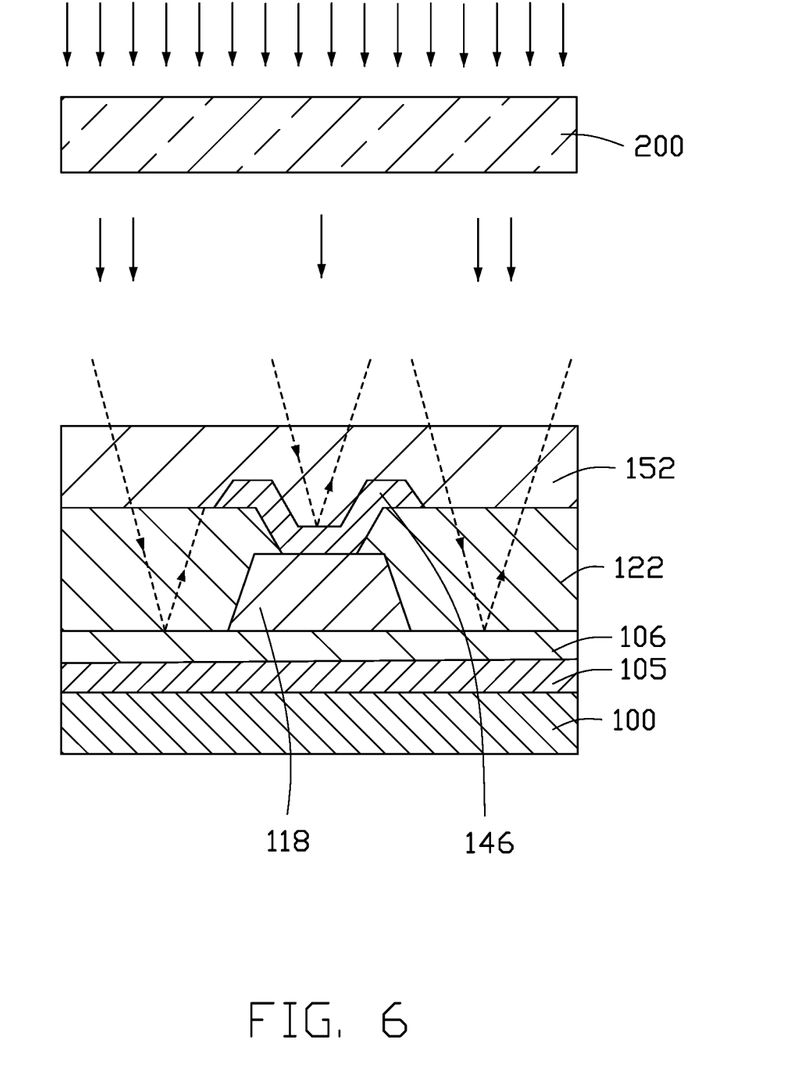

In block S205, the covering layer 152 is exposed by using a mask 200 (e.g. semi-transmissive) (shown in FIG. 6). The covering layer 152 is bleached by light irradiation. Light transmittance of the covering layer 152 increases, and the covering layer 152 forms a passivation layer.

As shown in FIG. 6, a portion of the light that enters the electrical connection structure is reflected by the connecting line 146 that is made of metal material. A portion of the light that enters the electrical connection structure is reflected by the mating layer 106. Interference between the two reflected lights is generated, thereby greatly reducing light reflected back into the covering layer 152 and reducing double exposure of the covering layer 152.

The method for making the electrical connection structure can effectively reduce light intensity in a position of the covering layer 152 aligning with the connecting line 146 by providing the mating layer 106. This avoids the covering layer 152 being destroyed by light, and a flat covering layer 152 is obtained.

The electrical connection structure shown in FIG. 6 includes the substrate 100, the buffer layer 105 formed on the substrate 100, the mating layer 106 formed on the buffer layer 105, the connecting pad 118 formed on the mating layer 106, the insulating layer 122 formed on the mating layer 106 and covering the connecting pad 118, the connecting line 146 formed on the insulating layer 122 and extending through the insulating layer 122 to electrically couple to the connecting pad 118, and the covering layer 152 formed on the insulating layer 122 and covering the connecting line 146. Both the connecting pad 118 and the connecting line 146 are made of a metal or a metal alloy.

Figure 7:
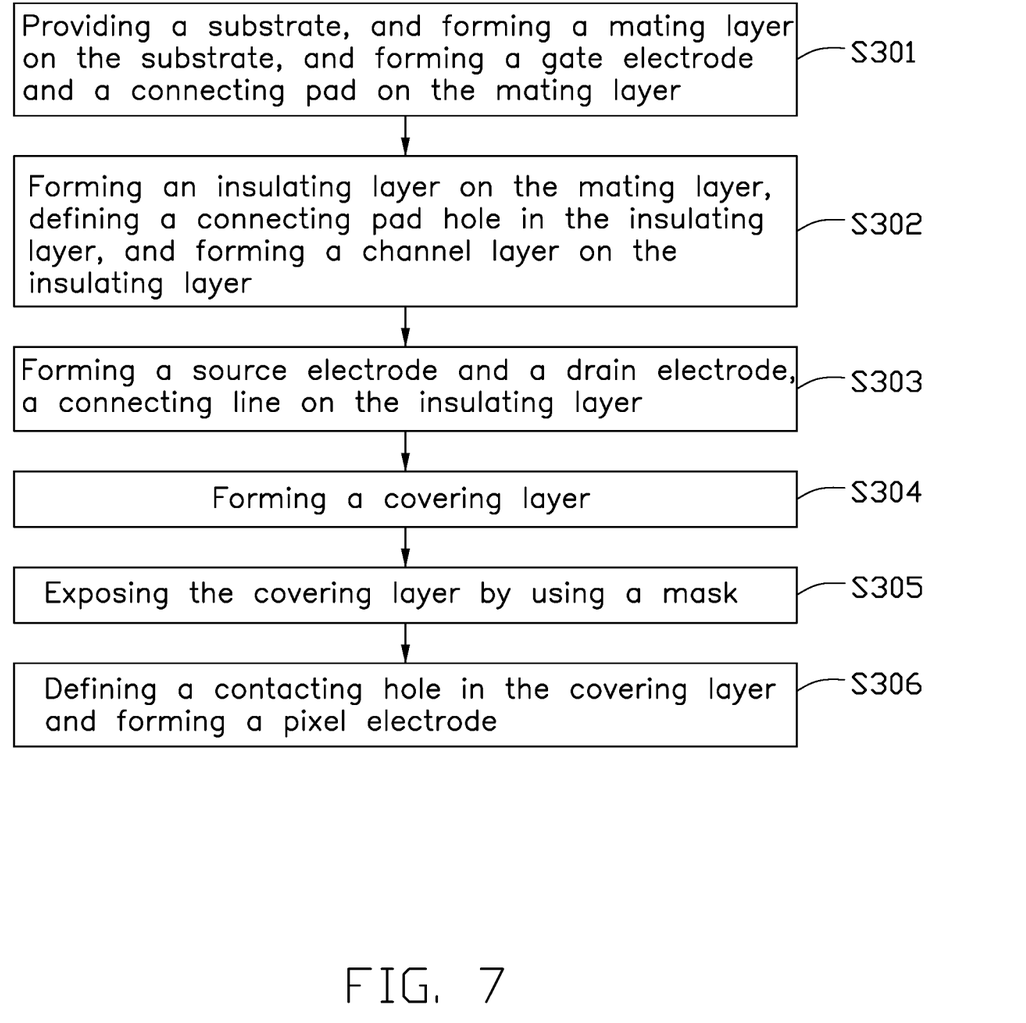
FIG. 7 is a flowchart of a method for making a TFT substrate according to an embodiment of the present disclosure.

FIG. 7 illustrates a method for making a TFT substrate as follows.

In block S301, a substrate 100 is provided, a buffer layer 105 is formed on the substrate 100, and a mating layer 106 is formed on the buffer layer 105. A gate electrode 114 and a connecting pad 118 are formed on the mating layer 106 (shown in FIG. 8).

Figure 8:
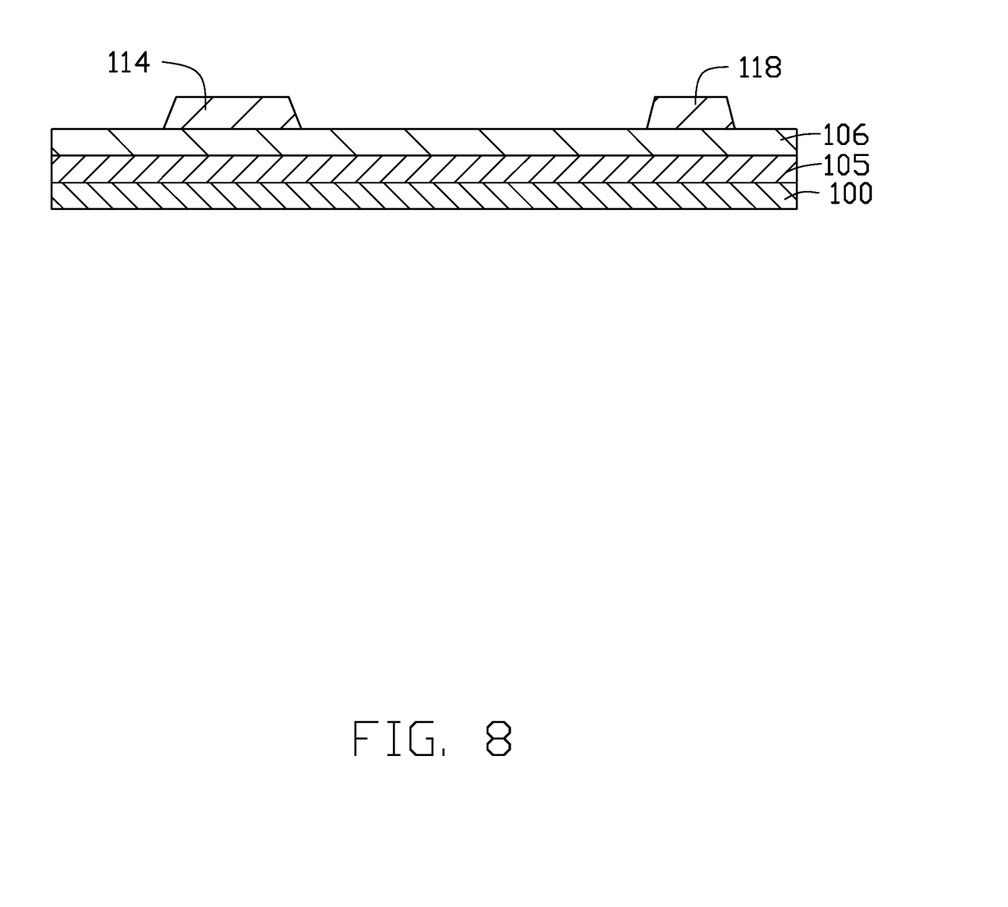
FIG. 8 through FIG. 13 are cross-sectional views showing steps of the method of FIG. 7.

As shown in FIG. 8, the buffer layer 105 covering the substrate 100 is firstly formed on the substrate 100. Then the mating layer 106 covering the buffer layer 105 is formed on the buffer layer 105, a metal layer (not shown) covering the mating layer 106 is formed on the mating layer 106, and finally the metal layer is patterned to form the gate electrode 114 and the connection pad 118.

In the present embodiment, the substrate 100 is made of a transparent material, such as transparent glass, transparent quartz, or transparent polymer. The buffer layer 105 is made of a transparent and insulating material, such as silicon oxide, silicon nitride, and silicon oxynitride.

It can be understood that the buffer layer 105 is not necessary. In other embodiments, the buffer layer 105 can be omitted and the mating layer 106 can be directly formed on the substrate 100.

As shown in FIG. 14, the mating layer 106 can be a multilayer film including yttrium oxide films 1061 and silicon oxide films 1062 which alternate. The mating layer 106 can have a thickness of 100-1000 angstroms.

Figure 9:
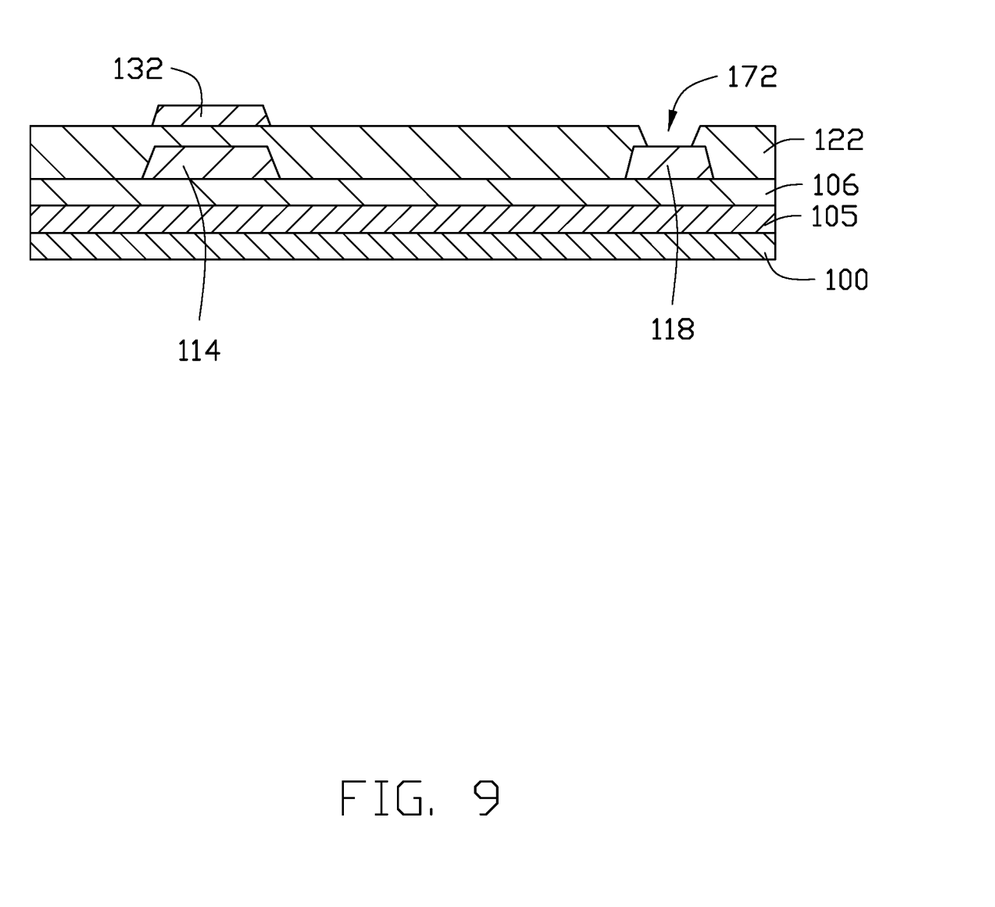

In block S302, an insulating layer 122 is formed on the mating layer 106, a connecting pad hole 172 is defined in the insulating layer 122, and a channel layer 132 is formed on the insulating layer 122 (shown in FIG. 9).

As shown in FIG. 9, the insulating layer 122 covers the gate electrode 114 and the connection pad 118. The insulating layer 122 is firstly formed on the mating layer 106, then a semiconductor layer (not shown) is formed on a side of the insulating layer 122 away from the substrate 100. The semiconductor layer is patterned to form the channel layer 132. When patterning the semiconductor layer, the insulating layer 122 is also patterned and etched to form the connecting pad hole 172 aligning with the connection pad 118. The channel layer 132 aligns with the gate electrode 114. The connection pad 118 is exposed from the insulating layer 122 by the connecting pad hole 172.

In the present embodiment, the insulating layer 122 is made of a transparent and insulating material, such as silicon oxide, silicon nitride, and silicon oxynitride. The channel layer 132 is made of a conventional semiconductor, such as metal oxide, amorphous silicon, or polycrystalline silicon.

Figure 10:
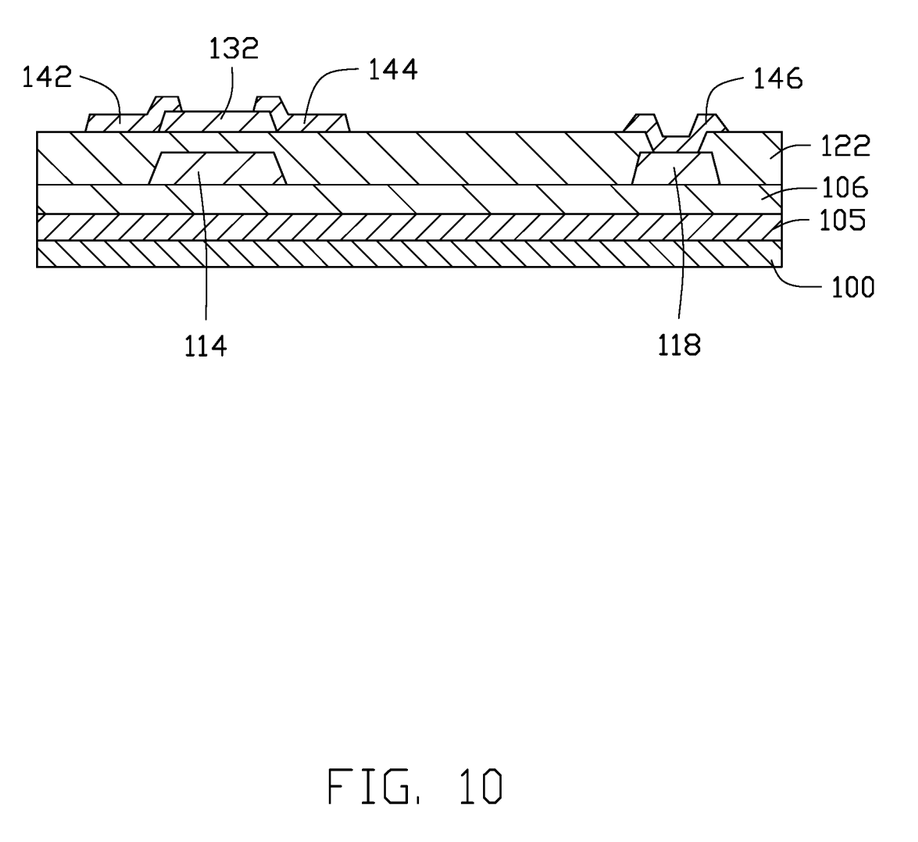

In block S303, a source electrode 142, a drain electrode 144, and a connecting line 146 are formed on the insulating layer 122 (shown in FIG. 10).

As shown in FIG. 10, the source electrode 142, the drain electrode 144, and the connecting line 146 are formed on the insulating layer 122. The source electrode 142 and the drain electrode 144 partially cover the channel layer 132 and are coupled to opposite sides of the channel layer 132. The connecting line 146 is formed on a side of the insulating layer 122 away from the substrate 100 and extends into the connecting pad hole 172 to electrically couple to the connection pad 118.

The source electrode 142, the drain electrode 144, and the connecting line 146 can be formed by forming a metal layer (not shown) on a side of the insulating layer 122 away from the substrate 100 and pattering the metal layer to form the source electrode 142, the drain electrode 144, and the connecting line 146.

In the present embodiment, the source electrode 142, the drain electrode 144, and the connecting line 146 can be made of at least one metal, such as, aluminum, titanium, molybdenum, niobium, and copper.

The gate electrode 114, the source electrode 142, the drain electrode 144, and the channel layer 132 form a thin film transistor (TFT). In the present embodiment, the TFT is a bottom gate TFT. The TFT is not limited to that described above, in other embodiments, the TFT may be a top gate TFT.

In block S304, a covering layer 152 is formed on the insulating layer 122. The covering layer 152 covers the channel layer 132, the source electrode 142, the drain electrode 144, and the connecting line 146 (shown in FIG. 11).

Figure 11:
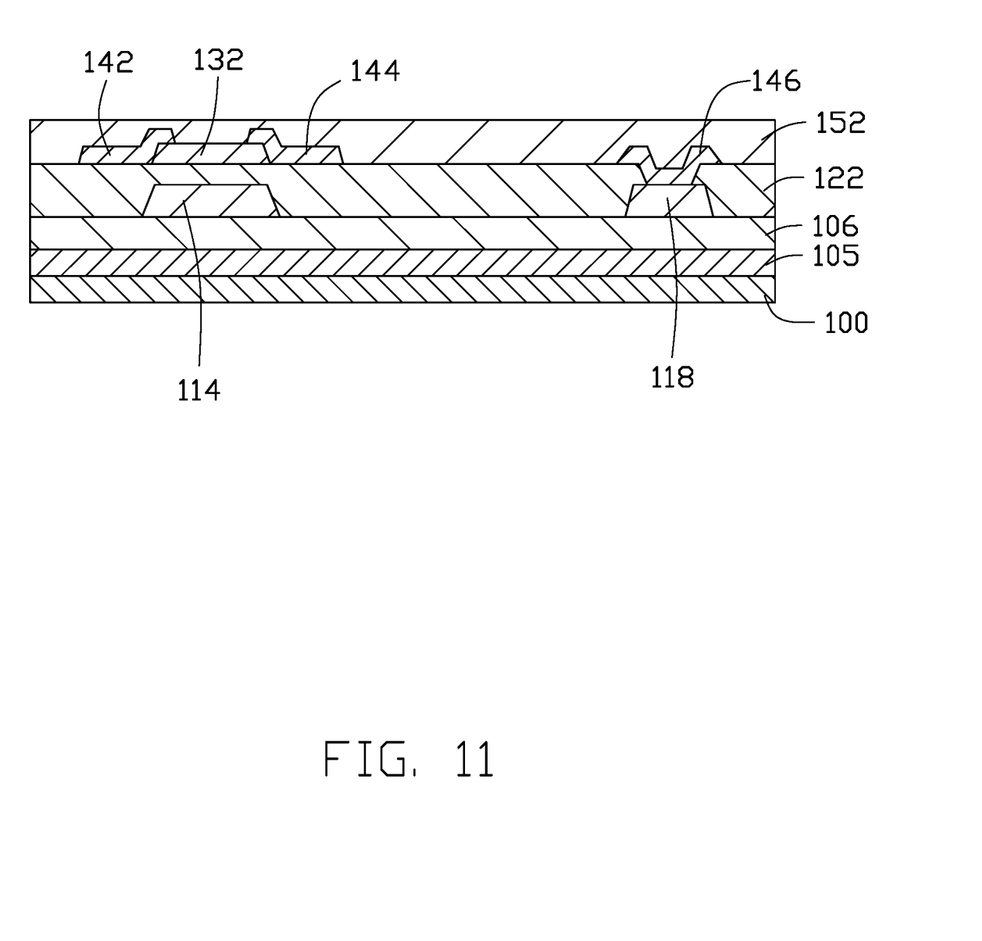

In the present embodiment, the covering layer 152 may be made of an organic material usually used as passivation layer, such as polycarbonate (PC) or benzocycloethylene (BCB).

Figure 12:
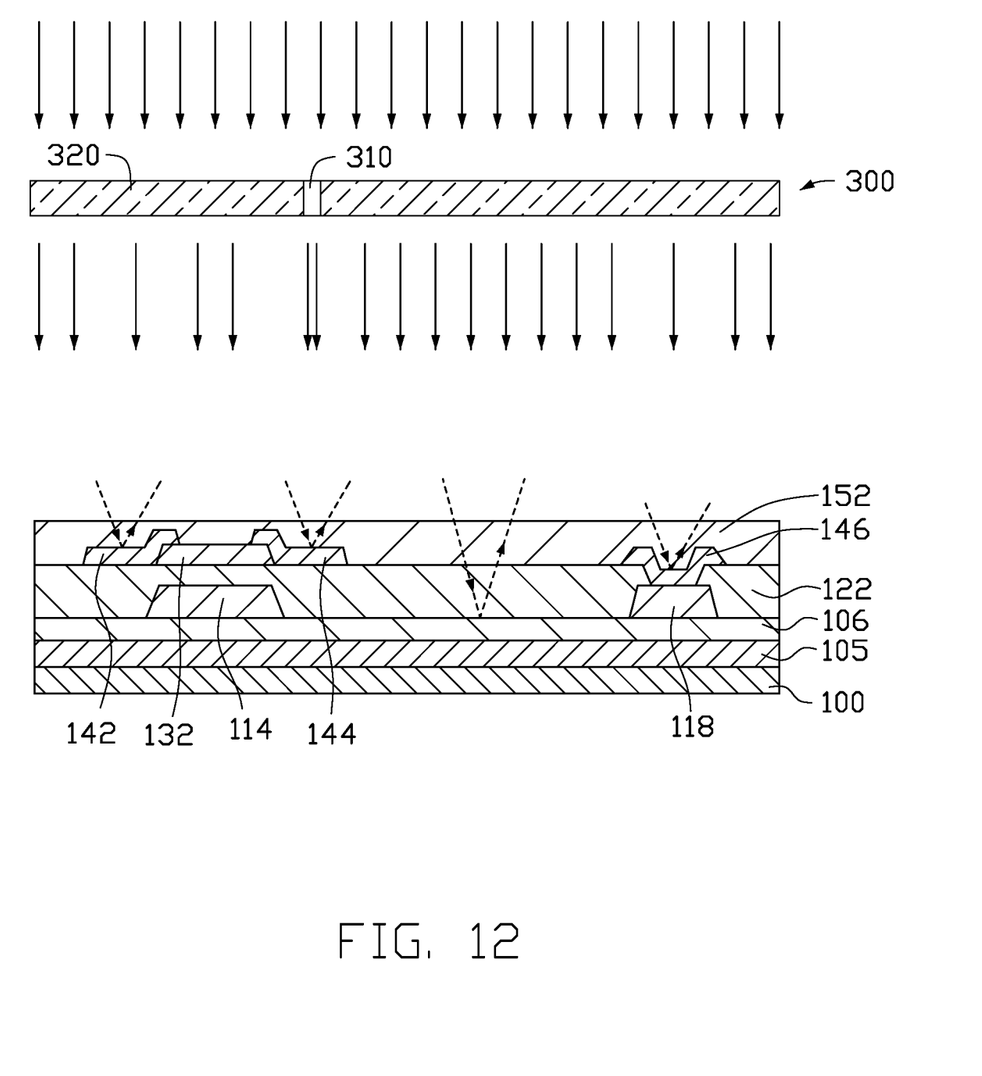

In block S305, the covering layer 152 is exposed by using a mask 300 (e.g. semi-transmissive) (shown in FIG. 12).

As shown in FIG. 12, the mask 300 includes a first mask portion 310 and a second mask portion 320 surrounding the first mask portion 310. The first mask portion 310 is transmissive, and light transmittance of the first mask portion 310 is higher than a light transmittance of the second mask portion 320 (semi-transmissive). The first mask portion 310 corresponds to and aligns with the drain electrode 144, and the second mask portion 320 corresponds to other regions of the covering layer 152. After irradiation with light, a portion of the covering layer 152 aligning with the first mask portion 310 is heavily irradiated and removed by a photoresist developing solution to form a contacting hole 174. Other portions of the covering layer 152 aligning with the second mask region 320 are bleached by irradiation with light, and the light transmittance of the covering layer 152 increases. The covering layer 152 forms a passivation layer.

A portion of the light that enters the TFT substrate is reflected by the source electrode 142, the drain electrode 144, and the connecting line 146. A portion of the light that enters the TFT substrate is reflected by the mating layer 106, and interference between the two reflected lights is generated, thereby greatly reducing light reflected back into the covering layer 152 and the consequent double exposure.

In block S306, a pixel electrode 162 is formed on the covering layer 152. The pixel electrode 162 extends into the contacting hole 174 and is electrically coupled to the drain electrode 144 (shown in FIG. 13).

Figure 13:
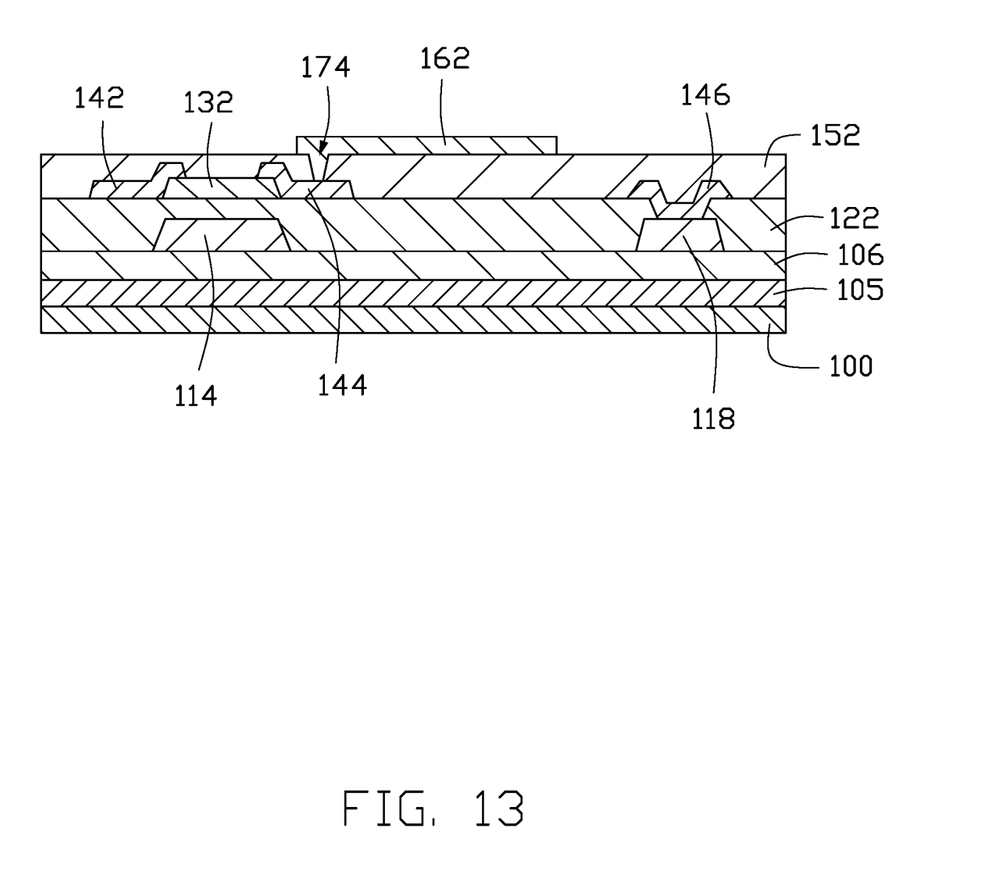

The pixel electrode 162 can be formed by forming a conductive layer (not shown) on a side of the covering layer 152 away from the substrate 100 and patterning the conductive layer to form the pixel electrode 162.

The TFT substrate shown in FIG. 13 includes the substrate 100, the buffer layer 105 formed on the substrate 100, the mating layer 106 formed on the buffer layer 105, the gate electrode 114 and the connecting pad 118 formed on the mating layer 106, and the insulating layer 122 formed on the mating layer 106. The insulating layer 122 covers the gate electrode 114 and the connecting pad 118. The TFT substrate also includes a channel layer 132 formed on the insulating layer 122 and aligning with the gate electrode 114. The TFT substrate further includes the source electrode 142 and the drain electrode 144 formed on the insulating layer 122 and coupled to opposite sides of the channel layer 132, the connecting line 146 formed on the insulating layer 122 and extending through the insulating layer 122 to electrically couple to the connecting pad 118, and the covering layer 152 formed on the insulating layer 122 and covering the channel layer 132, the source electrode 142, the drain electrode 144, and the connecting line 146. The source electrode 142, the drain electrode 144, the gate electrode 114, the connecting pad 118, and the connecting line 146 are made of a metal or a metal alloy.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for making an electrical connection structure, comprising:
    providing a substrate;
    forming a mating layer on the substrate, the mating layer comprising yttrium oxide films and silicon oxide films alternating with each other;
    forming a connecting pad on the mating layer;
    forming a connecting line on the connecting pad, the connecting line electrically coupling to the connecting pad, both the connecting pad and the connecting line made of metal;
    forming a covering layer covering the connecting line; and
    irradiating light onto the covering layer.

2. The method of claim 1, further comprising forming an insulating layer on the mating layer and defining a connecting pad hole in the insulating layer after forming the connecting pad and before forming the connecting line.

3. The method of claim 2, wherein the connecting line is formed on a side of the insulating layer away from the substrate; the connecting line extends into the connecting pad hole to electrically couple to the connection pad.

4. The method of claim 1, wherein the covering layer is formed on a side of the insulating layer away from the substrate; the covering layer is made of an insulating organic material.

5. The method of claim 4, wherein the mating layer has a thickness of 100-1000 angstroms.

6. A method for making a thin film transistor (TFT) substrate, comprising:
    providing a substrate;
        forming a mating layer on the substrate, the mating layer comprising yttrium oxide films and silicon oxide films alternating with each other;
        forming a TFT on the mating layer, the TFT comprising a gate electrode, a source electrode, and a drain electrode on the mating layer, the gate electrode, the source electrode, and the drain electrode made of metal or alloy;
        forming a covering layer covering the TFT; and
        irradiating light onto the covering layer by a mask.

7. The method of claim 6, wherein the mask comprises a first mask portion and a second mask portion surrounding the first mask portion; light transmittance of the first mask portion is higher than a light transmittance of the second mask portion; the first mask portion corresponds to and aligns with the drain electrode, and the second mask portion corresponds to other region of the covering layer.

8. The method of claim 6, wherein forming the TFT on the mating layer comprises:
    forming the gate electrode on the mating layer;
    forming an insulating layer on the mating layer, the insulating layer covering the gate electrode;
    forming a channel layer on the insulating layer, the channel layer aligning with the gate electrode; and
    forming the source electrode and the drain electrode on the insulating layer, the source electrode and the drain electrode coupled to opposite sides of the channel layer.

9. The method of claim 8, further comprising:
    forming a connecting pad on the mating layer when forming the gate electrode;
    defining a connecting pad hole in the insulating layer after forming the insulating layer; and
    forming a connecting line on the insulating layer when forming the source electrode and the drain electrode;

the connecting line extending into the connecting pad hole to electrically couple to the connecting pad.

10. The method of claim 9, wherein the connecting pad and the gate electrode are formed by patterning a single conductive layer; the connecting line, the source electrode, and the drain electrode layer are formed by patterning a single conductive layer.

\* \* \* \* \*